United States Patent [19]
Harrison et al.

[11] Patent Number: 5,318,949
[45] Date of Patent: Jun. 7, 1994

[54] SUPERCONDUCTING CERAMIC COMPOSITION COMPRISING (PB,CD)-SR-(Y,Q)-CU-O WHEREIN Q IS CA OR SR

[75] Inventors: Martin R. Harrison, Amersham; Simon R. Hall, Langley; Timothy P. Beales, Banbury, all of England

[73] Assignees: GEC-Marconi Limited; BICC Public Limited Company, both of England

[21] Appl. No.: 963,600

[22] Filed: Oct. 20, 1992

[30] Foreign Application Priority Data
Oct. 25, 1991 [GB] United Kingdom ............... 9122666
Nov. 13, 1991 [GB] United Kingdom ............... 9124083

[51] Int. Cl.$^5$ ............... C01F 11/02; C01G 3/02; C01G 11/00; H01L 39/12
[52] U.S. Cl. ............... 505/125; 252/521; 505/776; 505/779
[58] Field of Search ............... 252/521, 518; 505/1, 505/775, 776, 777, 778, 779, 780

[56] References Cited
FOREIGN PATENT DOCUMENTS
3122017 5/1991 Japan .

OTHER PUBLICATIONS
Rouillon "Superconductivity up to 100K in lead cuprater . . . " *Physica C* vol. 159 Jun. 1989 pp. 201–209.
Murphy "New Superconducting Cuprite Perovskiter" *Phys. Rev. Lett.* vol. 58 May 4, 1987 pp. 1888–1890.
Wada "Annealing Effect of high-Tc Superconducting" T$(Ba_{1-8}Sr_x)_2$ $Cu_3O_x$ *Jap. Jnl. Appl. Phys.* vol. 26(9) Sep. 1987 pp. L1475–1477.
Inoue "Superconductivity in a Ln-Pb-Sr-Ca-Cu-O System" *Jap. Jnl. Appl. Physic* vol. 28(1) Jan. 1989 pp. L60–62.
JP-3122017 Hibrid Tech. May, 1991 (Abstract).
"Superconductivity at 50K in (Pb0.5Cd0.5) Sr2 (Lux-Cal−x) Cu2Oz", Chinese Physics Letters, vol. 9, No. 10, Oct. 1992.
"An Enhancement of Tc, from 45K to 70K, via Cd Substituition in (Pb,Cu) Sr2 (Ca,Y) Cu2O7−d", Physica C, vol. 195, No. 1 & 2, May 20, 1992, North Holland.
88JP-232640 Okid (English Abstract) (Mar. 23, 1990).
88JP-108185 Fijitsu (English Abstract) (Nov. 8, 1985).
89EP-103557 Grace (English Abstract) (no month/date available).
90JP-268759 Seme (English Abstract) (May 19, 1992).
"Superconductivity" by A. Subramanian, et al., Mat. Res. Bull., vol. 26, pp. 91–95, 1991 (no month available).

*Primary Examiner*—Paul Lieberman
*Assistant Examiner*—John Boyd
*Attorney, Agent, or Firm*—Kirschstein, Ottinger, Israel & Schiffmiller

[57] ABSTRACT

A superconducting ceramic composition which is free of thallium, the composition having a unit cell containing two perovskite structure copper-oxygen planes and a rocksalt structure layer having a single plane containing cadmium.

3 Claims, No Drawings

SUPERCONDUCTING CERAMIC COMPOSITION COMPRISING (PB,CD)-SR-(Y,Q)-CU-O WHEREIN Q IS CA OR SR

BACKGROUND OF THE INVENTION

The invention relates to superconducting ceramic compositions. More particularly, the invention relates to superconducting ceramic materials of the kind termed 1212 with a unit cell containing two perovskite structure copper-oxygen planes (within which the supercurrent is confined) which are positioned between non-superconducting rocksalt structure layers comprising single planes of metal and oxygen ions (which supply the charge carriers necessary for the supercurrent).

The strong coupling of the charge carrier wavefunctions across the single planes of metal and oxygen ions means that superconducting ceramic materials with the 1212 structure exhibit stronger pinning of the magnetic flux lines in liquid nitrogen than materials with thicker rocksalt structure layers containing two or more planes of metal and oxygen ions.

A series of layered superconducting materials with 1212 structure are already known in which the cation composition of the insulating rocksalt structure layer is $(Tl_{1-x}Bi_x)$, $(Tl_{1-x}Pb_x)$ or $(Pb_{1-x}Cu_x)$. Examples of known compositions are:

$(Tl_{0.5}Bi_{0.5})\ Sr_2CaCu_2O_7$, $(Tl_{0.5}Pb_{0.5})\ Sr_2(Y_{0.2}Ca_{0.8})\ Cu_2O_7$, $(Pb_{0.5}Cu_{0.5})\ Sr_2\ (Y_{0.5}Ca_{0.5})\ Cu_2O_7$,

The prior art ceramic oxides pose the following problems:

(1) Although the thallium-containing ceramics exhibit the highest critical temperatures, the toxicity of thallium is a major problem in their large-scale utilisation.

(2) Due to thallium's high reactivity, thallium-containing ceramics are subject to degradation. A more chemically-stable substitute which maintains the desired superconducting properties has been the subject of intense research.

(3) With a lead-copper mixture in the rocksalt structure layer, the oxygen stoichiometry is difficult to control with the result that the optimum superconducting properties are not achieved. Examples of such elaborate techniques employed to achieve the optimum critical temperature in these materials are the use of high-pressure oxygen annealing in specialist furnaces or the quenching of samples from temperatures above 800° C. in air. Such procedures are not viable for industrial production.

SUMMARY OF THE INVENTION

According to the invention there is provided a superconducting ceramic composition which is free of thallium, the composition including perovskite structure copper-oxygen planes separated by rocksalt structure layers containing cadmium.

Further according to the invention there is provided a superconducting ceramic composition which is free of thallium, the composition having a unit cell containing two perovskite structure copper-oxygen planes and a rocksalt structure layer having a single plane containing cadmium.

According to the invention there is further provided a superconducting ceramic material;

$(A_{1-x}Cd_x)\ Sr_2\ (B_{1-y}Q_y)\ Cu_2O_7$ where A is Pb, B is at least one element selected from the group consisting of Y, La and the lanthanides, Q is at least one element selected from the group consisting of Mg, Ca, Sr and Ba, $x \leq 1$, and $y \leq 1$.

The above material has a 1212 structure in which each cell unit includes a $(B_{1-y}Q_y)$ layer positioned between two copper-oxygen planes, Sr ions positioned on the outersides of the two copper-oxygen planes and a rocksalt structure layer containing cadmium.

Further there are provided the following superconducting ceramic materials embodying the invention:

a) $(Pb_{1-x}Cd_x)\ Sr_2\ (Y_{1-y}Ca_y)\ Cu_2O_7$
b) $(Pb_{1-x}Cd_x)\ Sr_2\ (Y_{1-y}Sr_y)\ Cu_2O_7$ where $x \leq 1$ and $y \leq 1$.

Further there is provided the following superconducting ceramic material embodying the invention:

$(Pb_{0.5}Cd_{0.5})Sr_2\ (Y_{0.7}Ca_{0.3})Cu_2O_7$ which has a critical temperature of 81K.

The superconducting ceramic materials of the present invention are free of thallium. Their rocksalt structure contains cadmium but has no thallium.

According to another aspect of the present invention there is provided a method of producing a layered copper oxide ceramic superconductor material including at least two perovskite structure copper-oxygen planes positioned between rocksalt structure layers containing cadmium, the method including preparing an intimate mixture of an oxide of cadmium and oxides of metals selected from the metals of groups Ib, IIa, IIIb, IVa and the lanthanide series of the periodic table or precursors thereof and heating the mixture.

In an alternative embodiment the intimate mixture includes an oxo-acid salt of cadmium and oxo-acid salts of metals selected from the metals of groups Ib, IIa, IIIb, IVa and the lanthanide series of the periodic table or precursors thereof.

Preferably said intimate mixture is prepared by milling said metal oxides, oxo-acid salts or precursors thereof with a milling medium.

The superconducting ceramic material of the present invention may be provided in the form of a thin film formed on a substrate.

The superconducting ceramic oxides embodying the invention have the following advantages:

(1) It is found empirically that the maximum critical temperature is obtained in all of the copper-oxide based high critical temperature superconducting ceramic materials when the oxidation state of copper ions in the perovskite structure copper-oxygen planes is in the range between 2 and 2.4. For the material $(Pb_{0.5}Cd_{0.5})\ Sr_2\ (Y_{0.7}Ca_{0.3})\ Cu_2O_7$ embodying the present invention, this value of the oxidation state of the copper ions is achieved by simple cooling of the sample in air, thereby removing the need to employ any post-calcination technique such as those necessary for materials with the lead-copper mixture in the rocksalt structure layer.

(2) The chemical inertness of cadmium oxides in comparison with thallium oxides means that it is more suitable for use in contact with substrate or cladding materials. For example, the lack of reaction with silver is an advantage in the powder-in-tube technology currently employed in making wires of high critical temperature superconducting ceramics. Thalliun-containing superconductors processed using the powder-in-tube technology can exhibit reactions which lead to multi-phase products.

(3) For thin film applications, the volatility of thallium oxide leads to non-stoichiometry of the film and a deterioration of the superconducting properties. Cadmium oxide has a lower volatility, resembling the group IIa metal oxides SrO and CaO used in the synthesis of the layered copper-oxide high critical temperature ceramic superconductors.

DETAILED DESCRIPTION OF THE PREFERRED EMBODIMENTS

In one embodiment of the present invention cadmium is incorporated into the rocksalt structure layer of a layered copper oxide ceramic superconductor prepared from the intimate mixture of cadmium oxide and oxides of metals selected from the metals of groups Ib, IIa, IIIB, IVa and the lanthanide series of the periodic table or precursors thereof.

The experimental method, for example, is the preparation of the intimate mixture of the oxides with a milling medium which may be aqueous, organic or a mixture thereof. The milling procedure produces a slurry which is preferably dried prior to calcination. When the intimately milled slurry contains the mixed metal oxides, the calcination is carried out at a temperature above 600° C., preferably at a temperature above 800° C. However, when the milled slurry contains precursors of the mixed oxides, the calcination may be effected at a temperature below 600° C.

In a further embodiment of the invention, the cadmium is incorporated into the rocksalt structure layer of a layered copper oxide ceramic superconductor by co-precipitation of an oxo-acid salt of cadmium and oxo-acid salts of metals selected from the metals of groups Ib, IIa, IIIB, IVa and the lanthanide series of the periodic table or precursors thereof. Suitable precursors are, for example:

$M(NO_3)_x \cdot yH_2O$, $M(CO_3)_x \cdot yH_2O$, $MO_x \cdot yH_2O$, $M(C_2O_4)_x \cdot yH_2O$, $M(OH)_x \cdot yH_2O$, $M(EDTA)_x \cdot yH_2O$ In addition, metal oxo-acid salts such as citrates, catecholates or acetylacetonates may be used.

EXAMPLE

A typical sample is prepared as follows using metal-EDTA solutions as precursors. The nominal composition of the sample is:

$(Pb_{0.5}Cd_{0.5}) Sr_2(Y_{0.7}Ca_{0.3})Cu_2O_7$.

0.631 ml of Pb solution (0.105M in Pb), 0.676 ml of Cd solution (0.098M in Cd), 2.87 ml of Sr solution (0.094M in Sr), 0.900ml of Y solution (0.103M in Y), 0.355 ml of Ca solution (0.112M in Ca), and 2.622 ml of Cu solution (0.101M in Cu) are mixed and deposited into a beaker. This process is repeated ten times and the resulting solution is then evaporated down to a gel. The gel is then decomposed at 1500° C. for 2 hours in a fan-assisted oven.

The residue in the beaker is transferred to a 5% yttria-stabilised zirconia crucible which is then placed in a Lenton Thermal Design model UCF12/B box furnace equipped with a Cambridge model 701 temperature controller and subjected to the following heat treatment in still air:

(1) Heating at 30° C. per minute to 250° C. and holding at this temperature for 30 minutes.

(2) Heating at 30° C. per minute to 500° C. and holding at this temperature for 30 minutes.

(3) Heating at 30° C. per minute to 850° C. and holding at this temperature for 16 hours.

(4) Cooling at the natural rate of the furnace to room temperature.

The critical temperature of the sample is determined using a Quantum Design model MPMS SQUID magnetometer using the following procedure:

(1) The sample is cooled to 5K in the residual magnetic field of the superconducting magnet (less than 10G).

(2) A magnetic field of 100G is then applied and the magnetisation of the sample recorded at 1K intervals up to 100K.

(3) The critical temperature is taken as the highest temperature at which the sample is diamagnetic. For this sample the critical temperature is 81K.

In this specification the pre 1986 Chemistry Abstracts Group Classification is used.

I claim:

1. A superconducting ceramic material:

$(Pb_{1-x}Cd_x) Sr_2 (Y_{1-y}Q_y) Cu_2O_7$ where Q is Ca or Sr, $0<X<1$ and $0 \leq y<1$.

2. A superconducting ceramic material as claimed in claim 1, in which y is from 0 to 0.3.

3. A superconducting ceramic material:

$(Pb_{0.5}Cd_{0.5}) Sr_2 (Y_{0.7}Ca_{0.3})Cu_2O_7$.

* * * * *

UNITED STATES PATENT AND TRADEMARK OFFICE
CERTIFICATE OF CORRECTION

PATENT NO. : 5,318,949
DATED : June 7, 1994
INVENTOR(S) : Martin R. Harrison et al It is certified that error appears in the above-indentified patent and that said Letters Patent is hereby corrected as shown below:

In the Title, on the cover page, at item [54], and also at col. 1, lines 2 and 3, change "(PB, CD) - SR - (Y, Q) - CU - O WHEREIN Q IS CA OR SR" to -- (Pb, Cd) - Sr - (Y, Q) - Cu - O WHEREIN Q IS Ca OR Sr --.

On the cover page, at item [56], under the heading "OTHER PUBLICATIONS", lines 1 and 2, change "cuprater" to -- cuprates --; and at line 3, change "Perovskiter" to -- Perovskites --.

Signed and Sealed this

Seventeenth Day of October, 1995

Attest:

BRUCE LEHMAN

Attesting Officer

Commissioner of Patents and Trademarks